United States Patent [19]

Schachameyer et al.

[11] Patent Number: 4,685,976
[45] Date of Patent: Aug. 11, 1987

[54] MULTI-LAYER SEMICONDUCTOR PROCESSING WITH SCAVENGING BETWEEN LAYERS BY EXCIMER LASER

[75] Inventors: Steven R. Schachameyer, Whitefish Bay; James A. Benjamin, Waukesha; John B. Pardee, Milwaukee, all of Wis.; Lyle O. Hoppie, Birmingham, Mich.

[73] Assignee: Eaton Corporation, Cleveland, Ohio

[21] Appl. No.: 736,934

[22] Filed: May 22, 1985

Related U.S. Application Data

[63] Continuation-in-part of Ser. No. 721,783, Apr. 10, 1985, abandoned.

[51] Int. Cl.$^4$ .................. H01L 21/265; B05D 5/12
[52] U.S. Cl. ............................ 437/173; 427/38; 427/53.1; 437/81; 437/20; 148/DIG. 93
[58] Field of Search .................. 148/1.5, 187, 175; 29/576 B, 576 T; 427/53.1, 38

[56] References Cited

U.S. PATENT DOCUMENTS

| | | | |
|---|---|---|---|
| 4,340,617 | 7/1982 | Deutsch et al. | 427/53.1 |
| 4,490,211 | 12/1984 | Chen et al. | 156/643 |
| 4,529,617 | 7/1985 | Chenevas-Paule | 427/53.1 |

OTHER PUBLICATIONS

Roth et al., in Mat. Res. Soc. Symp. Proc. ed., Osgood et al., vol. 17, (1983), North-Holland, N.Y., p. 193.
Kaplan et al., Jour. Electrochem. Soc., 117, (1970), pp. 693-700.
Hess et al., Jour. Appl. Phys., 43, (1972), pp. 4680-4683.
Vig et al., Tech. Report, U.S. Army Electronics Tech. & Devices Lab. (ECOM), Ft. Monmouth, N.J., (1975), pp. 220-226.
Allen et al., Jour. Vac. Sci. Technol., 16, (1979), p. 431.
Eden et al., IEEE Spectrum, Apr. 1979, pp. 50-59.
Deutsch et al., Appl. Phys. Letts., 35, (1979), pp. 175-177.
Deutsch et al., Appl. Phys. Lett., 36, (1980), pp. 847-849.
Ehrlich et al., Appl. Phys. Lett., 36, (1980), pp. 916-918.
Hanabusa et al., Appl. Phys. Lett., 38, (1981), pp. 385-387.
Zavelovich et al., Jour. Chem. Phys., 74, (1981), pp. 6787-6791.
Hanabusa et al., Appl. Phys. Lett., 39, (1981), pp. 431-432.
Allen et al., Jour. Appl. Phys., 52, (1981), p. 6501.
Ehrlich et al., Jour. Vac. Sci. Technol., 20(3), [1982], pp. 738-739.
Bauerle et al., Appl. Phys Letts., 40, (1982), pp. 819-821.
Tsao et al., IEEE-Electron Device Letts., EDL-3, (1982), pp. 164-166.
Yasaitis et al., IEEE-Electron Device Letts., EDL-3, (1982), p. 184.
Solanski et al., Appl. Phys. Letts., 41, (1982), pp. 1048-1050.
Boyer et al., Rept. ". . . Dep.". . . UV Laser Dept. E.E., Colorado St. Univ., Fort Collins, CO 80523, p. 120.
Roth et al., Rept.,' Inst. Semiconductor Electronics, Aachen, W. Germany, D-5100, Jan. 6, 1983.

(List continued on next page.)

Primary Examiner—Upendra Roy
Attorney, Agent, or Firm—Andrus, Sceales, Starke & Sawall

[57] ABSTRACT

A semiconductor processing technique is disclosed for forming a multi-layered semiconductor structure in a single chamber and with the same equipment, without removing the semiconductor wafer substrate or otherwise transferring it to another chamber. A gaseous mixture of different gases is provided in a chamber. Excimer pulsed ultraviolet laser radiation is introduced into the chamber at a first discrete wavelength to photolytically react with a first of the gases at a discrete excitation energy photochemically breaking bonds of the first gas to epitaxially deposit a first layer on the substrate, followed by radiation at a second discrete wavelength to photolytically react with a second gas to deposit a second layer on the first layer, and so on. The different gases may be introduced into the chamber collectively, or serially between radiations. Scavenging between layers is provided by photolytic removal of surface containments and the products of reaction.

12 Claims, 3 Drawing Figures

OTHER PUBLICATIONS

Wood et al., Appl. Phy. Lett., 42, (1983), pp. 408–410.
Tsao et al., Appl. Phys. Lett., 42, (1983), pp. 559–561.
Solanski et al., Appl. Phys. Lett., 42, (1983), pp. 662–663.
Abstract of Tutorial Sessions "CUD-Plasma: Laser Processing", May 17, 1983, Sessions TUA1–TUA3 and TUF1 to TUF5.
Cheung, J. T. et al., Appl. Phys. Letts., 43, (1983), pp. 255–257.
Solanski et al., Appl. Phys. Letts., 43, (1983), pp. 454–456.
Jain, K., Laser & Applications, Sep. 1983, pp. 49–56.
Swenson, E. J., Solid St. Tech., Nov. 1983, pp. 156–158.
Gattuso et al., Mat. Res. Soc. Symp., Proc. 17, (1983), pp. 215–222.
Osgood, Jr., "Excimer Laser . . . for . . . Processing", AIP, 1983, pp. 215–222.
Rytz-Froidevaux et al., MRS-Symp. Proc., 17, (1983), pp. 29–34.
Chen et al., MRS-Symp. Proc., 17, (1983), p. 169.
Emery et al., Rept., Colorado St. Univ., Ft. Collins, Dept. E.E., Colorado, (1983).
Lloyd et al., Rept. Gegvres. Lab., Hirst Res. Centre, Wembley, U.K., (1983).
Ibbs et al., Optics & Laser Tech., Feb. 1984, pp. 37–39.
Edwall et al., Jour. Appl. Phys. 55, (1984), 1453.
Kawamura et al., Jour. Appl. Phys., 55, (1984), p. 1607.
Aizaki, N. A., Appl. Phys. Letts., 44, (1984), 686–86.
Donnelly et al., Appl. Phys. Letts., 44, (1984), pp. 951–953.
Anon, Rept., In Photonics Spectra, Jun. 1984, pp. 97–104.
Belforte, Laser & Appl., Aug. 1984, pp. 55–62.
Davis et al., Jour. Appl. Phys., 56, (1984), pp. 1808–1811.
Geohegan et al., Appl. Phys. Letts., 45, (1984), pp. 1146–1148.
Boyer et al., Appl. Phys. Letts., 45, (1984), pp. 979–981.
Hargis et al., Solid St. Technol., (Nov. 1984), pp. 127–133.
Reif, R., M.I.T., Dept. of E.E., Cambridge, Mass. 02139, Dec. 12, 1984, pp. 1–19.
Lakhani, A. A., Solid St. Electronics, 27, (1984), pp. 921–924.
Roth et al., Microelectronics Jour., 15, (1984), pp. 26–29.
Thompson, C. J., Dept. of Mat. Sci. & Engg., M.I.T., Cambridge, MA 02139, 1984.
Solanski, Raj, Solid State Technol., June 1985, pp. 220–227.
Pummer, H., Photonics Spectra, May 1985, pp. 73–82.
Holmes, L., Laser Focus/Electro-Optics, May 1985, pp. 146–54.
Iscoff, L., Semiconductor International, May 1985, pp. 77, 79–84.
Van Scoy, R. L., Photonics Spectra, May 1985, pp. 67–70.
Case, et al., Lasers & Applications, Mar. 1985, pp. 85–90.
Van Scoy, Photonics Spectra, Apr. 1985, pp. 67–70.
C. Breck Hitz & J. J. Ewing (Interview) Lasers & Applications, Apr. 1985, pp. 65–70.
Report "Laser (Excimer) Product Matrix - - ," Laser & Applications, Apr. 1985, pp. 71–80.

WAVELENGTH (nm)
EXCITATION ENERGY (eV)

MULTI-LAYER SEMICONDUCTOR PROCESSING WITH SCAVENGING BETWEEN LAYERS BY EXCIMER LASER

BACKGROUND AND SUMMARY

This application is a C.I.P. of application Ser. No. 06/721,783 filed Apr. 10, 1985, now abandoned.

The present invention provides a single chamber methodology for thin film, multi-layered structures using a mixture of gases and excimer pulsed ultraviolet laser photochemical selectivity.

In processing a semiconductor to a multi-layered structure, it is typically necessary to move the wafer substrate to different chambers for deposition or diffusion of different dopants or material types. This is because the deposition or diffusion is a thermal process providing a thermally driven pyrolytic reaction at elevated temperatures typically around 1,000° C. At these temperatures, the reactant gas is thermally activated and broken down to break the chemical bonds of the gas molecules and drive the constituents throughout the processing chamber, substantially contaminating such chamber with that type of material and making it difficult to purge same. If the wafer is to be reacted with another type of material, the wafer is typically moved to another chamber. These transfer steps and multiple processing steps are particularly cost objectionable and not amenable to manufacturing efficiency. Furthermore, the rate and extent of growth of the various layers is difficult to control with a thermal process, and is thus objectionable in high precision applications.

The present invention addresses and solves the above noted and other problems.

DETAILED DESCRIPTION

Figure 1:
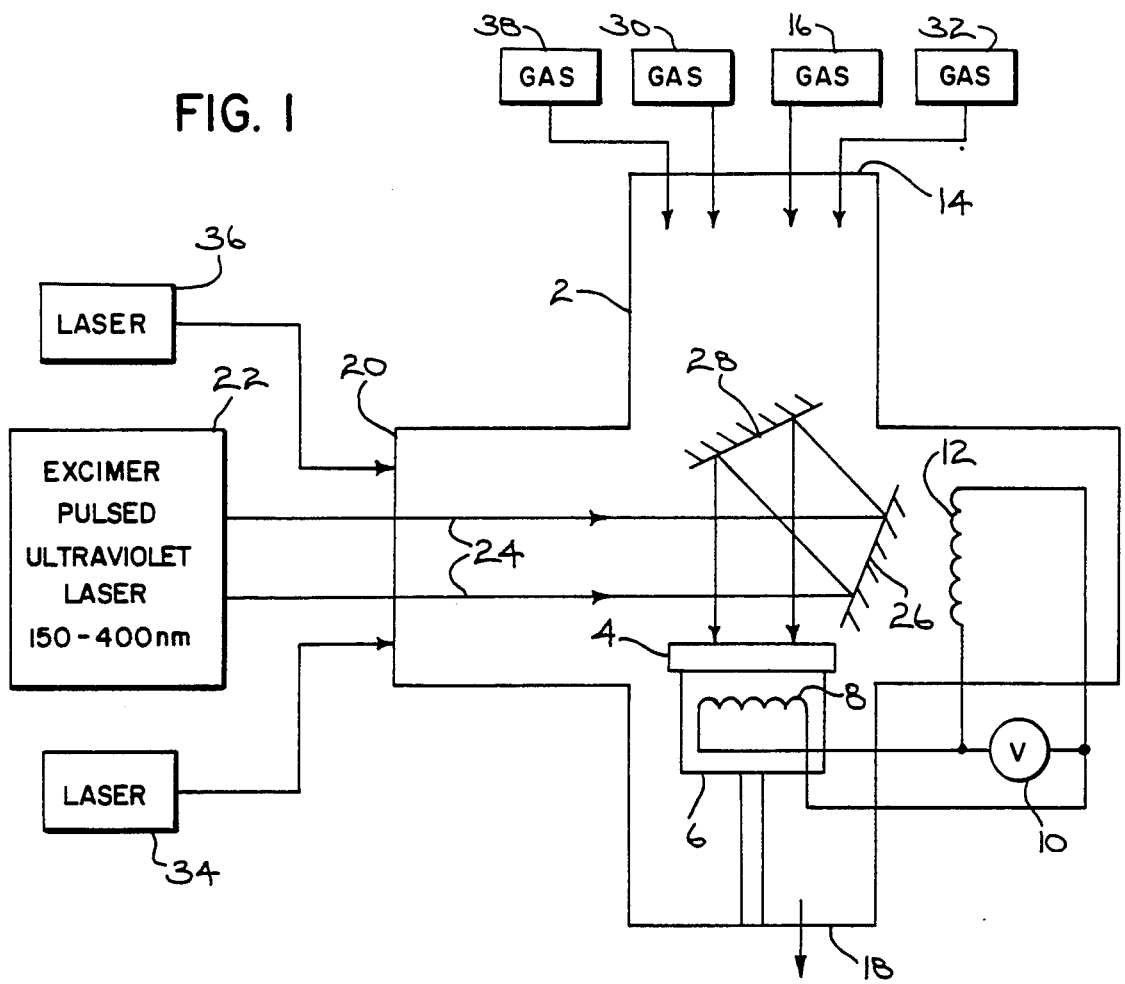
FIG. 1 illustrates a single chamber semiconductor processing technique in accordance with the invention.

FIG. 1 illustrates a single chamber semiconductor processing technique for a multi-layered semiconductor structure. A conventional processing chamber 2 is provided, and a semiconductor wafer substrate 4 is placed in the chamber on a pedestal support 6 typically having a resistance heater coil 8 or the like driven by a voltage source 10 for heating the substrate and/or a resistance heater coil 12 in the chamber for heating the interior thereof. These thermal processing elements are optional in the present methodology. A reactant gas may be introduced into chamber 2 at port 14 from gas supply 16, and may be evacuated at port 18, all as is conventional. Chamber 2 typically includes an observation window or port 20.

Excimer pulsed ultraviolet laser radiation from laser 22 is introduced into the chamber at 24 through port 20 and reacts with the gas therein, and may be directed by mirrors 26 and 28 to impinge wafer substrate 4. A gaseous mixture of different gases from the same supply 16 or from different supplies such as 30, 16 and 32, is introduced into the chamber. The excimer laser radiation is introduced into the chamber at a first discrete wavelength to photolytically react with a first of the gases, for example the gas from source 30, at a discrete excitation energy photochemically breaking bonds of the first gas to expitaxially deposit a first layer on substrate 4, without thermally driven pyrolytic deposition. Excimer laser radiation of a second discrete wavelength is then introduced into the chamber to photolytically react with a second of the gases, such as the gas from source 16, at a discrete excitation energy photochemically breaking bonds of the second gas to deposit a second layer on the first layer, against without thermally driven pryolytic deposition. Further different wavelengths of excimer laser radiation are introduced into the chamber as needed for further layers from further different gases, for example from third gas source 32. The excimer pulsed ultraviolet laser means 22 provides photochemical selectivity in depositing layers from the gaseous mixture in the same chamber 2 without removal of substrate 4. Laser means 22 may be tuned to provide the different wavelengths, or second and so on lasers such as 34 may be provided.

In a particularly desirable implementation, the methodology provides photolytic epitaxial deposition of layers which are all single crystalline at a temperature ranging from room temperature to about 400° C. at discrete pulsed wavelengths corresponding to discrete excitation energies providing uniform nucleation and crystallization across large area without hot spot focusing, and eliminating growth from separate islands. The excimer laser means is tunable in the ultraviolet region between about 150 and 400 nanometers, and provides precise control of the rate of deposition and growth by controlling the duration of excimer laser radiation. This affords substantially more accurate layer thickness control than a pyrolytic thermal process at substantially higher temperatures typically around 1,000° C.

Figure 3:
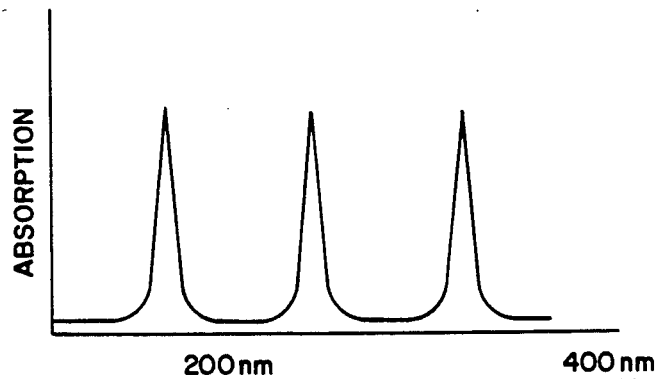
FIG. 3 illustrates a gas absorption spectrum.
Figure 2:
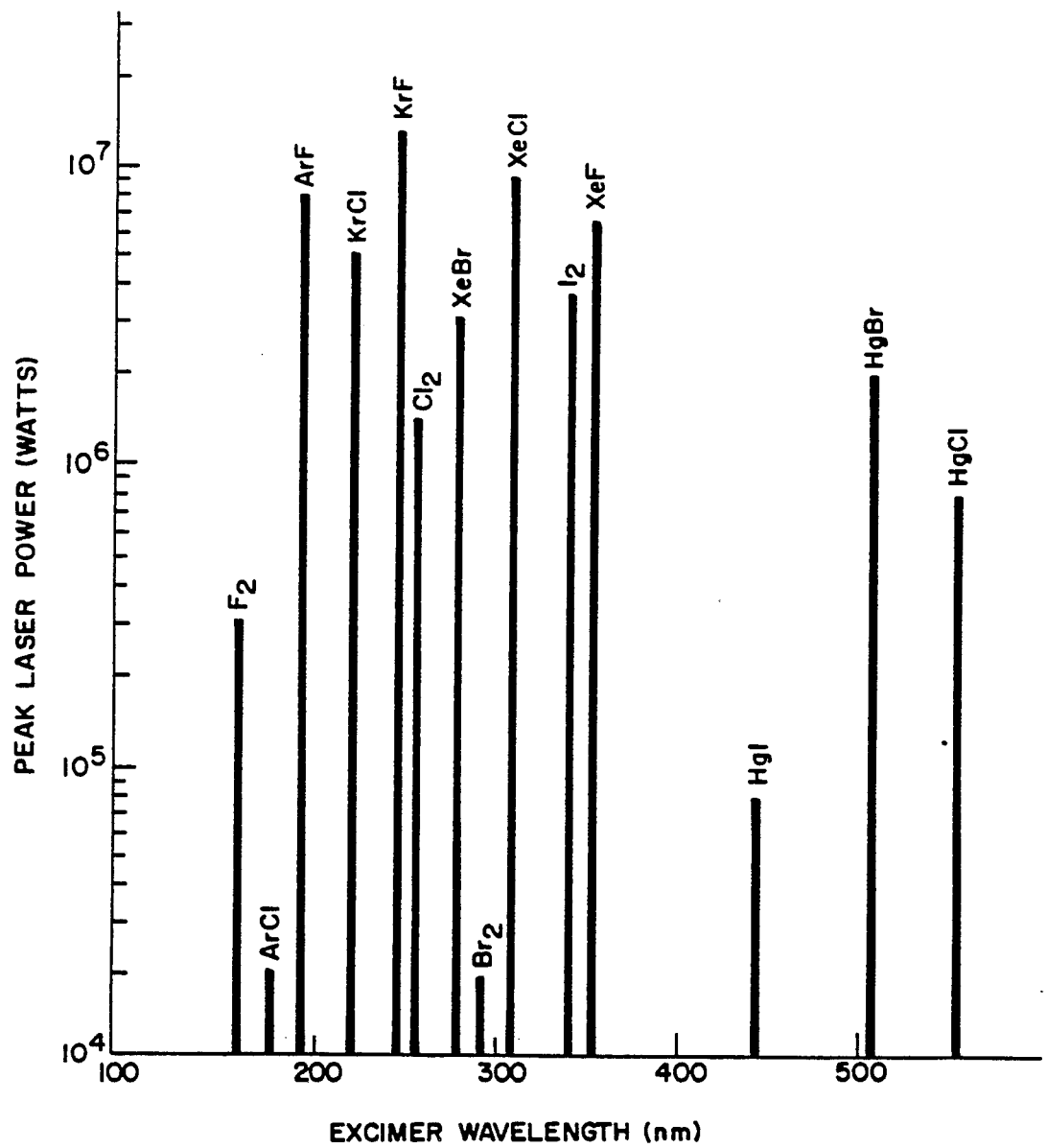
FIG. 2 illustrates available excimer pulsed ultraviolet laser radiation wavelengths and peak power.

FIG. 2 shows available excimer pulsed ultraviolet laser radiation wavelengths and peak power. FIG. 3 shows a gas absorption spectrum with absorption peaks corresponding to excitation energy wavelengths. The excimer laser wavelength is chosen according to the selectively desired gas absorption peak, or vice versa. The narrow spectral output of the excimer laser enables highly specific electronic excitation of reactants, allowing selective breaking of a particular gas molecule's bonds, driving a predetermined controllable reaction. The highly selective nature of the tunable narrow excimer spectral output enables differential breaking of chemical bonds of a particular type of gas molecule from a mixture of gases. This enables fabrication of multi-layered structures within the same chamber and with the same equipment, thus significantly improving manufacturing efficiency and also providing desirable control for high precision applications. The reactions may be carried out at low temperature, without thermally driven pyrolytic reaction.

In an alternative, a first gas from supply 30 may be introduced into chamber 2, followed by excimer pulsed ultraviolet laser radiation at a first discrete wavelength to photolytically react with the first gas at a discrete excitation energy photochemically breaking bonds of the first gas to epitaxially deposit a first layer on the substrate, again at a temperature ranging from room temperature to about 400° C., without thermally driven pyrolytic deposition. A second gas from source 16 may then be introduced into chamber 2, followed by excimer laser radiation at a second discrete wavelength to photolytically react with the second gas at a discrete excitation energy photochemically breaking bonds of the second gas to epitaxially deposit a second layer on the first layer, again without thermally driven pyrolytic deposition. Further gases may then be introduced and further different wavelengths of radiation are introduced as needed for depositing further layers in the same chamber 2 without removal of substrate 4.

The first gas from source 30 may if desired be removed from chamber 2 prior to introduction of the second gas from supply 16. This removal of the first gas is facilitated by the nonthermal photolytic excimer laser deposition eliminating thermally driven pyrolytic processing which would otherwise cause thermally driven absorption of the first gas through the chamber and in turn difficult removal thereof. The second gas from source 16 may likewise be removed before introduction of a third gas from source 32, and so on.

After each layer is formed, surface contaminants are removed therefrom. Excimer pulsed ultraviolet laser radiation of a different wavelength from laser 22 or from a second laser 36 is used to scavenge the products of reaction of layer formation. The excimer pulsed ultraviolet laser radiation from laser 36 photolytically treats and removes surface contaminants from the layer just formed, still without pyrolytic thermal processing. In one embodiment, low temperature excimer pulse ultraviolet laser radiation of the layer provides direct photolytic removal of surface contaminants either before formation of the next layer or concurrently therewith. In another embodiment, the gaseous mixture in chamber 2 also includes scavenger gas, for example from source 38. The excimer pulsed ultraviolet laser radiation from laser 36 or another wavelength from laser 22 is introduced into the chamber at a designated wavelength in the presence of the scavenger gas to photolytically react with and activate the gas to release scavenging agents to remove surface contaminants from the layer, to enable subsequent or concurrent in-situ uniform growth of the next layer. The substrate is also preferably irradiated to enhance scavenging action. The scavenger gas is preferably nitrogen dioxide or carbon tetrafluoride and photolytically reacts with the excimer laser radiation to produce scavenging radicals, ions or neutrals to remove surface contaminant species. The scavenger gas and the various dopant gases from sources 30, 16 and 32 are preferably benign relative to each other and activated at different scavenging and dopant wavelengths.

It is recognized that various alternatives and modifications are possible within the scope of the appended claims.

We claim:

1. A single chamber semiconductor processing technique for a multi-layered semiconductor structure, comprising:
   providing a chamber capable of receiving gas;
   placing a semiconductor wafer substrate in said chamber;
   introducing a gaseous mixture of different gases into said chamber; and
   providing excimer pulsed ultraviolet laser means and introducing radiation from said excimer laser means into said chamber at a first discrete wavelength to photolytically react with a first of said gases at a discrete excitation energy photochemically breaking bonds of said first gas to epitaxially deposit a first layer on said substrate, without thermally driven pyrolytic deposition,
   introducing radiation from said excimer laser means into said chamber at a second discrete wavelength to photolytically react with a second of said gases at a discrete excitation energy photochemically breaking bonds of said second gas to deposit a second layer on said first layer, without thermally driven pyrolytic deposition, and
   introducing further different wavelengths of radiation from said excimer laser means for further layers from further different said gases, said excimer laser means providing photochemical selectivity in depositing layers from said gaseous miture in the same said chamber without removal of said substrate, and all without changing or adding to said gaseous mixture in said chamber, and
   introducing additional scavenging wavelengths of radiation from said excimer laser means after formation of one or more of said layers to photolytically treat and remove surface contaminants and scavenge the products of reaction of layer formation.

2. The invention according to claim 1 wherein said scavenging wavelength is different than said layer formation wavelengths.

3. The invention according to claim 1 comprising:
   providing a scavenger gas as part of said mixture in said chamer; and
   irradiating said scavenger gas with said scavenger wavelength of said excimer pulsed ultraviolet laser radiation to photolytically react with and activate said scavenger gas and release scavenging agents to remove surface contaminants from the layer.

4. The invention according to claim 1 comprising scavenging and removing surface contaminants from said one layer prior to formation of the next layer.

5. The invention according to claim 1 comprising scavenging and removing surface contaminants from said one layer concurrently with formation of the next layer thereon.

6. The invention according to claim 1 comprising photolytically epitaxially depositing single crystalline each said layer at a temperature ranging from room temperature to about 400° C. at discrete pulsed wavelengths corresponding to discrete excitation energies providing uniform nucleation and crystallization across large areas without hot spot focusing, and eliminating growth from separate islands.

7. The invention according to claim 1 comprising providing said excimer laser means tunable in the ultraviolet region between about 150 and 400 nanometers, and providing said radiation up to about 1 joule per pulse at up to about 250 hertz.

8. The invention according to claim 3 wherein said scavenger gas is selected from the group consisting of nitrogen dioxide and carbon tetrafluoride and photolytically reacts with said excimer laser radiation to produce scavenging radicals, ions or neutrals.

9. The invention according to claim 7 comprising precisely controlling the rate of deposition and growth by controlling the duration of said excimer laser means radiation, whereby to afford substantially more accurate layer thickness control than a pyrolytic thermal process.

10. The invention according to claim 8 wherein said scavenger gas and said layer-forming gases are benign relative to each other and activated at different excimer pulsed ultraviolet laser radiation wavelengths.

11. The invention according to claim 8 comprising irradiating the layer with said scavenger wavelength excimer pulsed ultraviolet laser radiation to enhance scavenging action.

12. A single chamber semiconductor processing technique for a multi-layered semiconductor structure, comprising:

providing a chamber capable of receiving gas;

placing a semiconductor wafer substrate in said chamber;

introducing a gaseous mixture of different gases into said chamber; and providing excimer pulsed ultraviolet laser means and introducing radiation from said excimer laser means into said chamber at a first discrete wavelength to photolytically react with a first of said gases at a discrete excitation energy photochemically breaking bonds of said first gas to expitaxially deposit a first layer on said substrate, without thermally driven pyrolytic deposition, introducing radiation from said excimer laser means into said chamber at a second discrete wavelength to photolytically react with a second of said gases at a discrete excitiation energy photochemically breaking bonds of said second gas to deposit a second layer on said first layer, without thermally driven pyrolytic deposition, and introducing further different wavelengths of radiation from said excimer laser means for further layers from further different said gases, said excimer laser means providing photochemical selectivity in depositing layers from said gaseous mixture in the same said chamber without removal of said substrate, and all without changing or adding to said gaseous mixture in said chamber.

* * * * *